United States Patent
Miyashita

(10) Patent No.: US 10,184,966 B2
(45) Date of Patent: Jan. 22, 2019

(54) SIGNAL INSPECTION APPARATUS, SIGNAL INSPECTION SYSTEM, SIGNAL INSPECTION METHOD, AND NON-TRANSITORY COMPUTER-READABLE MEDIUM ENCODED WITH SIGNAL INSPECTION PROGRAM

(71) Applicant: FANUC CORPORATION, Yamanashi (JP)

(72) Inventor: Shouhei Miyashita, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 181 days.

(21) Appl. No.: 15/436,077

(22) Filed: Feb. 17, 2017

(65) Prior Publication Data

US 2017/0242060 A1 Aug. 24, 2017

(30) Foreign Application Priority Data

Feb. 24, 2016 (JP) .................. 2016-032916

(51) Int. Cl.
 *G01R 23/10* (2006.01)
 *G01R 23/15* (2006.01)

(52) U.S. Cl.
 CPC ............. *G01R 23/10* (2013.01); *G01R 23/15* (2013.01)

(58) Field of Classification Search
 None
 See application file for complete search history.

(56) References Cited

U.S. PATENT DOCUMENTS

| | | | | |
|---|---|---|---|---|
| 3,537,002 A * | 10/1970 | Haner | ....................... | G01P 3/60 324/161 |
| 4,008,378 A * | 2/1977 | Nance | .................. | H04B 14/066 370/436 |
| 9,606,077 B2 * | 3/2017 | Kjar | ....................... | G01N 27/02 |
| 2002/0186773 A1 * | 12/2002 | Okamoto | ................. | H04N 5/14 375/240.25 |

FOREIGN PATENT DOCUMENTS

| | | |
|---|---|---|
| JP | 08-123540 | 5/1996 |
| JP | 08-221116 | 8/1996 |
| JP | 2005-227873 | 8/2005 |

* cited by examiner

*Primary Examiner* — Paresh H Patel
(74) *Attorney, Agent, or Firm* — Wenderoth, Lind & Ponack, L.L.P.

(57) ABSTRACT

A signal inspection apparatus, a signal inspection system, a signal inspection method, and a non-transitory computer-readable medium encoded with a signal inspection program are provided, all of which can appropriately detect discrepancy between multiplexed signals. A signal inspection apparatus includes: an acquisition unit that acquires values of at least two signals among multiplexed signals in a predetermined cycle; a count unit that counts respective changes in the at least two signals in a predetermined time frame; a calculation unit that calculates a difference between the counts of changes; and an output unit that performs an output indicating discrepancy between the signals, if the difference between the counts of changes exceeds an allowable value.

7 Claims, 4 Drawing Sheets

SIGNAL INSPECTION APPARATUS, SIGNAL INSPECTION SYSTEM, SIGNAL INSPECTION METHOD, AND NON-TRANSITORY COMPUTER-READABLE MEDIUM ENCODED WITH SIGNAL INSPECTION PROGRAM

This application is based on and claims the benefit of priority from Japanese Patent Application No. 2016-032916, filed on 24 Feb. 2016, the content of which is incorporated herein by reference.

BACKGROUND OF THE INVENTION

Field of the Invention

The present invention relates to a signal inspection apparatus, a signal inspection system, a signal inspection method, and a signal inspection program, all of which inspect discrepancy between multiplexed signals.

Related Art

Conventionally, in a programmable controller for controlling machine tools, etc., signals, for which a high level of safety is required, such as signals sent from an emergency shutdown switch or a limit switch, for example, are multiplexed so as to suppress malfunction.

A technique for enhancing the safety has been known, in which a plurality of CPUs (Central Processing Units) process such multiplexed signals, and cross-check mutual values of signals in a certain cycle.

For example, Patent Document 1 proposes a technique, in which two CPUs incorporated in a CNC (Computerized Numerical Control) device are used to cross-check mutual values of duplexed signals, and if a period of discrepancy between the signals exceeds an allowable period, the power to a drive circuit is shut down.

Patent Document 1: Japanese Unexamined Patent Application, Publication No. 2005-227873

SUMMARY OF THE INVENTION

Meanwhile, a phenomenon called chattering has been known, in which a movable contact, etc. of a switch, upon entering a contact state, cause an extremely fast and minute mechanical vibration.

However, as in the conventional art, a method for detecting signal abnormality, when a state of discrepancy between multiplexed signals exceeds an allowable period, was not able to detect signal abnormality such as chattering in a short cycle which does not exceed the allowable period.

An object of the present invention is to provide a signal inspection apparatus, a signal inspection system, a signal inspection method, and a non-transitory computer-readable medium encoded with a signal inspection program, all of which can appropriately detect discrepancy between multiplexed signals.

(1) A signal inspection apparatus (for example, a signal inspection apparatus 1 to be described later) according to a first aspect of the present invention includes: an acquisition unit (for example, an acquisition unit 11 to be described later) that acquires values of at least two signals among multiplexed signals in a predetermined cycle; a count unit (for example, a count unit 12 to be described later) that counts respective changes in the at least two signals in a predetermined time frame; a calculation unit (for example, a calculation unit 13 to be described later) that calculates a difference between the counts of changes in the at least two signals; and an output unit (for example, an output unit 14 to be described later) that performs an output indicating discrepancy between the at least two signals, if the difference between the counts of changes exceeds an allowable value.

(2) In the signal inspection apparatus according to the first aspect, the count unit may start counting afresh after the predetermined time frame elapses.

(3) In the signal inspection apparatus according to the first aspect, the count unit may count respective changes in the at least two signals in the latest predetermined time frame, in each of the predetermined cycle.

(4) In the signal inspection apparatus according to any one of the first to third aspects, the output unit may perform an output indicating a signal having a higher count of changes than others.

(5) A signal inspection system (for example, a signal inspection system 100 to be described later) according to a fifth aspect of the present invention includes a plurality of the signal inspection apparatuses according to any one of the first to fourth aspects, respectively corresponding to the multiplexed signals, in which the signal inspection apparatuses each generate and output a control signal based on a corresponding signal.

(6) A signal inspection method according to a sixth aspect of the present invention causes a computer to execute: an acquiring step of acquiring values of at least two signals among multiplexed signals in a predetermined cycle; a counting step of counting respective changes in the at least two signals in a predetermined time frame; a calculating step of calculating a difference between the counts of changes in the at least two signals; and an outputting step of performing an output indicating discrepancy between the at least two signals, if the difference between the counts of changes exceeds an allowable value.

(7) A signal inspection program stored in a non-transitory computer-readable medium according to a seventh aspect of the present invention causes a computer to execute: an acquiring step of acquiring values of at least two signals among multiplexed signals in a predetermined cycle; a counting step of counting respective changes in the at least two signals in a predetermined time frame; a calculating step of calculating a difference between the counts of changes in the at least two signals; and an outputting step of performing an output indicating discrepancy between the at least two signals, if the difference between the counts of changes exceeds an allowable value.

According to the present invention, discrepancy between multiplexed signals can be appropriately detected.

DETAILED DESCRIPTION OF THE INVENTION

One example of an embodiment of the present invention is hereinafter described.

Figure 1:
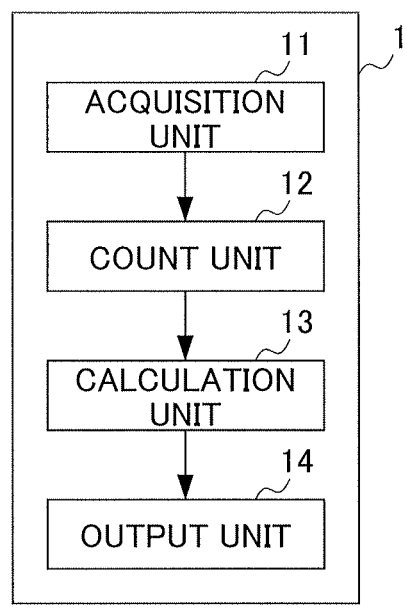
FIG. 1 is a block diagram illustrating a functional configuration of a signal inspection apparatus according to an embodiment.

FIG. 1 is a block diagram illustrating a functional configuration of a signal inspection apparatus 1 according to the present embodiment.

The signal inspection apparatus 1 is an information processor (computer) including a control unit (for example, CPU), and executes predetermined processing (signal inspection method) on multiplexed signals as an input.

The control unit includes an acquisition unit 11, a count unit 12, a calculation unit 13, and an output unit 14. Each of these units is implemented by way of the control unit that executes predetermined software (signal inspection program) stored in the signal inspection apparatus 1.

The acquisition unit 11 acquires values of at least two signals among multiplexed signals in a predetermined sampling cycle, and records the sampled values.

The count unit 12 counts a change in the sampled values recorded in a predetermined time frame, for each of the at least two signals.

As a scheme for setting up a predetermined time frame to count, for example, any one of the following two sampling schemes can be employed.

(1) The count unit 12 processes the sampled values in a predetermined time frame, and subsequently processes the sampled values in the next predetermined time frame. Namely, the count unit 12 starts counting afresh after a predetermined time frame elapses.

(2) The count unit counts a change in each of at least two signals in the latest predetermined time frame, in each sampling cycle. Namely, each time the count unit 12 acquires the latest sampled value, the count unit 12 discards the old sampled values, and processes sampled values in a predetermined time frame.

Figure 2:
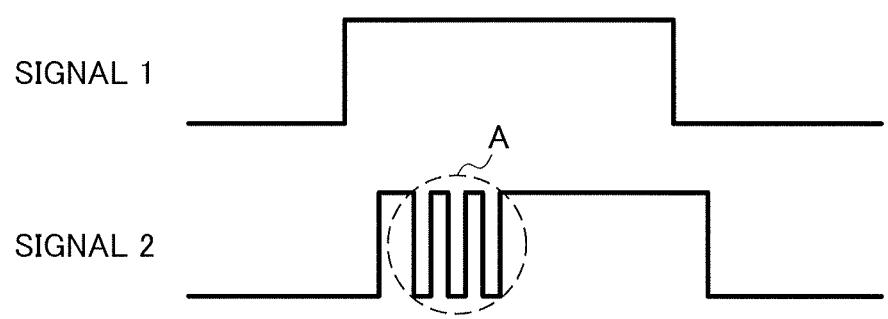
FIG. 2 is a diagram illustrating an example of multiplexed signals according to the embodiment.

FIG. 2 is a diagram illustrating an example of multiplexed signals according to the present embodiment.

In this example, the signal is duplexed.

The value of a signal 1 changes from zero to one, and subsequently changes to zero again. In contrast, the value of a signal 2 changes from zero to one, after which the chattering occurs in a time zone denoted by a reference symbol A.

Figure 3:
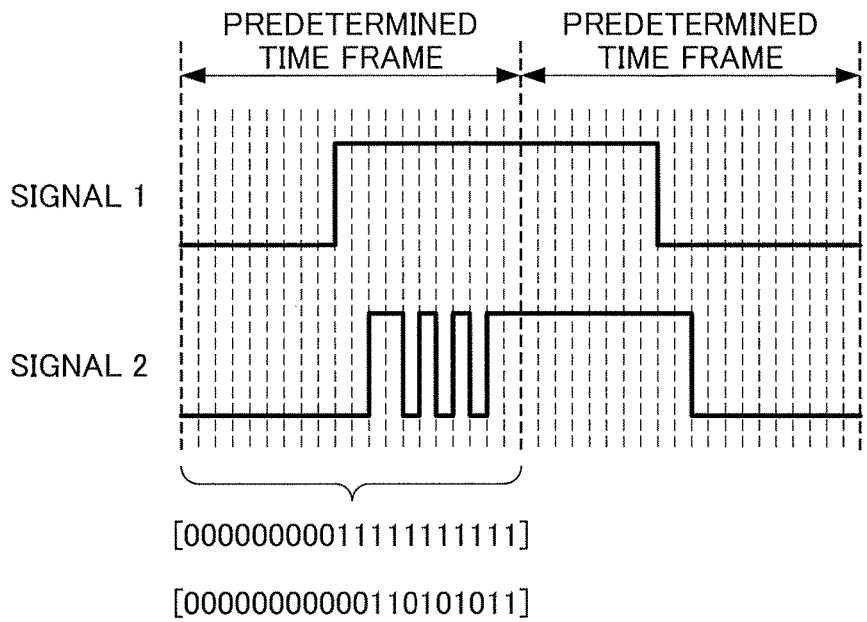
FIG. 3 is a diagram illustrating an example of a first sampling scheme according to the embodiment.

FIG. 3 is a diagram illustrating an example of a first sampling scheme for multiplexed signals according to the present embodiment.

In this example, the values of duplexed signals are acquired in each sampling cycle illustrated with broken lines, in each of the consecutive predetermined time frames.

Specifically, sampled values [00000000011111111111] are recorded from the signal 1 in a predetermined time frame. Further, sampled values [00000000000110101011] are recorded from the signal 2 in the predetermined time frame.

In this case, the count of changes in each signal in the predetermined time frame, i.e. the number of times the value changes from zero to one, or one to zero, is one for the signal 1, and seven for the signal 2.

Figure 4:
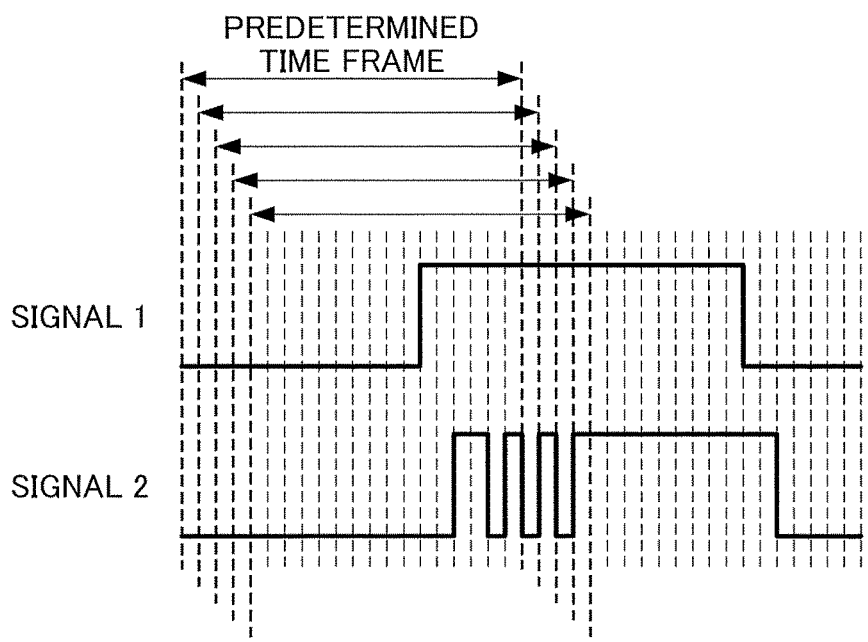
FIG. 4 is a diagram illustrating an example of a second sampling scheme according to the embodiment.

FIG. 4 is a diagram illustrating an example of a second sampling scheme for multiplexed signals according to the present embodiment.

In this example, in each sampling cycle illustrated with broken lines, the oldest data is discarded, and a predetermined time frame including the latest sampled value is set up.

In the first sampling scheme, signal inspection processing is performed in each predetermined time frame; whereas, in the second sampling scheme, signal inspection processing is performed in each sampling cycle.

The calculation unit 13 calculates a difference between the counts of changes in the sampled values of at least two signals.

Specifically, in the example in FIG. 3, the calculation unit 13 calculates|count of changes in signal 1 (1)−count of changes in signal 2 (7)|=6.

If the difference between the counts of changes calculated by way of the calculation unit 13 exceeds a preset allowable value, the output unit 14 performs an output indicating discrepancy between the at least two signals.

For example, if the allowable value is 5, since the difference=6 in the count of changes in the example in FIG. 3 exceeds the allowable value, the output unit 14 performs an output of a status signal indicating discrepancy between the signals, or an output of an alarm message, lamp or sound.

Here, for example, the output unit 14 determines and reports discrepancy between a particular signal and another signal, among the multiplexed signals.

Further, the output unit 14 may perform an output indicating a signal having a higher count of changes than others. As a result, signal abnormality in a short cycle such as chattering is detected.

Figure 5:
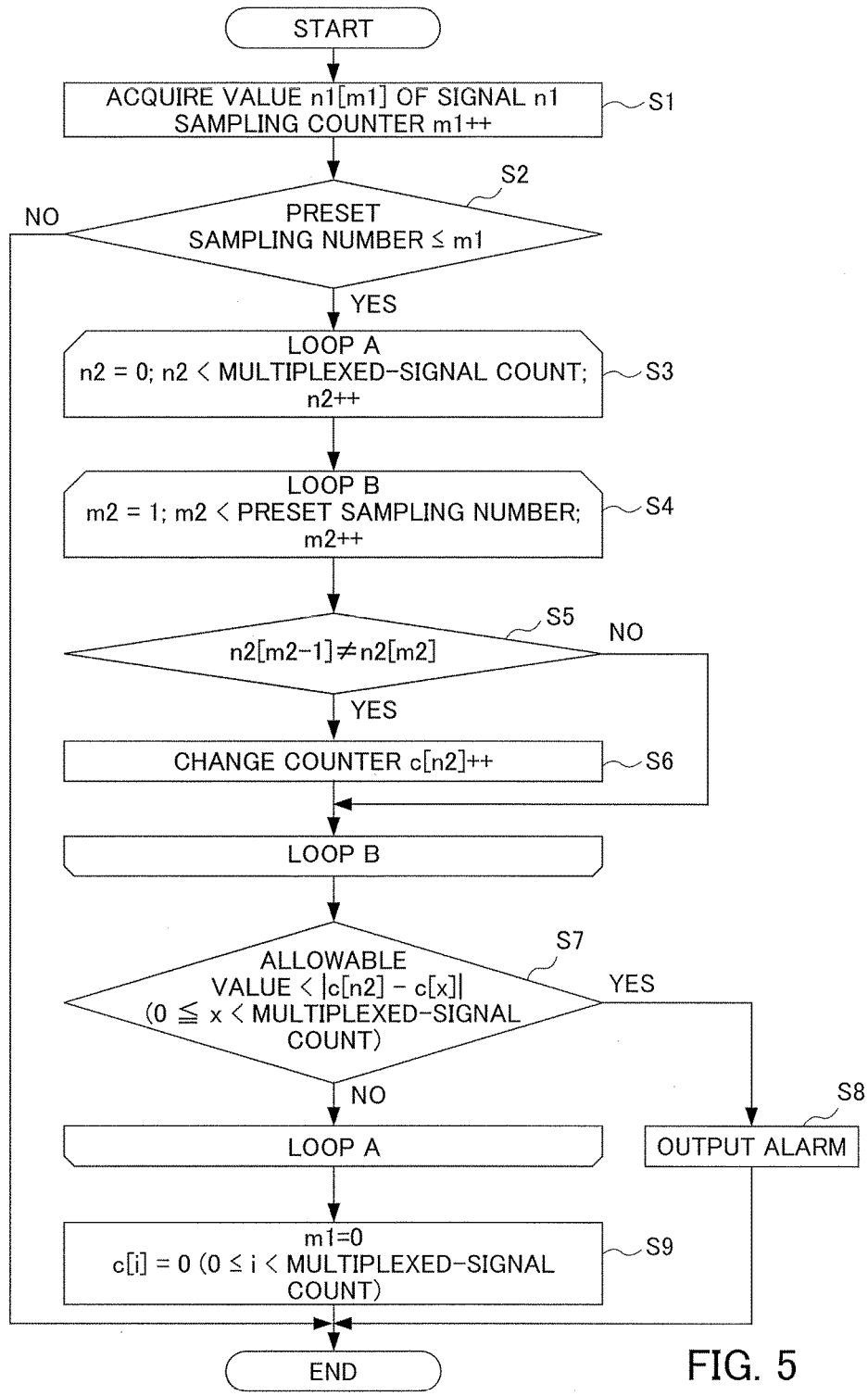
FIG. 5 is a flowchart illustrating an example of signal inspection processing according to the embodiment.

FIG. 5 is a flowchart illustrating an example of the signal inspection processing according to the present embodiment.

In the present processing example, the signal inspection apparatus 1 determines and reports discrepancy between a particular signal and another signal, by way of the first sampling scheme.

Note that, prior to the present processing, an allowable value of difference between the counts of changes is set up in advance and a sampling number is set up in advance as a predetermined time frame being the time for monitoring the count of changes in signals. Further, a sampling counter m1, and a change counter c[i] for all of the multiplexed signals (0≤i≤multiplexed-signal count) are initialized to 0.

In Step S1, the acquisition unit 11 acquires a sampled value (n1[m1]) of each of the multiplexed signals n1 (0≤n1<multiplexed-signal count), and increases the sampling counter m1 (adds 1 thereto).

In Step S2, the acquisition unit 11 determines whether the sampling counter m1 has reached a preset sampling number. If the determination is NO, the processing ends; and if the determination is YES, the processing advances to Step S3.

In Step S3, the count unit 12 sequentially increases the number n2 from zero, which is assigned to each of the multiplexed signals, and performs loop processing A in relation to the signal count.

In Step S4, the count unit 12 sequentially increases the sampling counter m2 from 1, and performs loop processing B in relation to the sampling number.

In Step S5, the count unit 12 determines whether the sampled value (n2[m2]) acquired in Step S1 differs from an immediately prior sampled value (n2[m2−1]). If the determination is YES, the processing advances to Step S6; and if the determination is NO, the processing advances to the loop determination of Step S4.

In Step S6, the count unit 12 increases the change counter c[n2].

In Step S7, the calculation unit 13 calculates a difference between the counts of changes ($|c[n2]-c[x]|$) between an arbitrary signal ($x^{th}$ signal) and an n $2^{nd}$ signal; and the output unit 14 determines whether the difference exceeds a preset allowable value. If the determination is YES, the processing advances to Step S8; and if the determination is NO, the processing advances to the loop determination of Step S3.

In Step S8, since the discrepancy between the counts of changes in the signals has exceeded the allowable value, the output unit 14 determines that a signal x or a signal n2 has abnormality, and outputs an alarm.

In Step S9, the signal inspection apparatus 1 initializes the sampling counter m1 and the change counter for all of the multiplexed signals c[i] ($0 \le i \le$ multiplexed-signal count) to 0.

Figure 6:
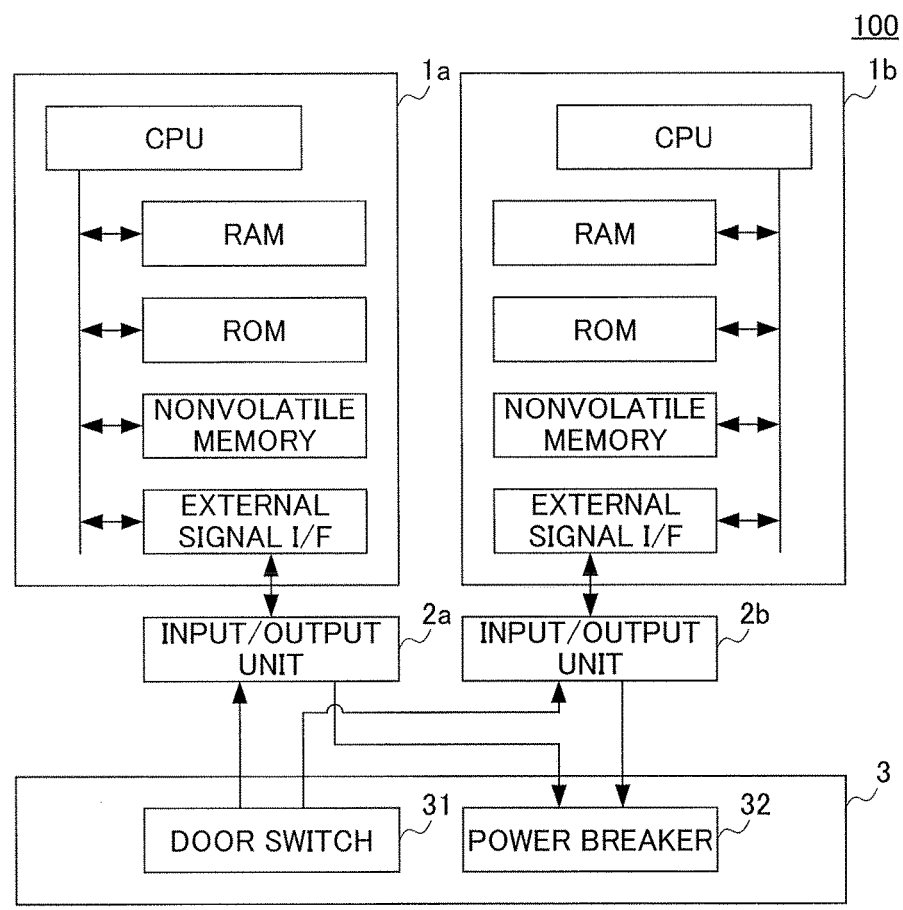
FIG. 6 is a diagram illustrating a configuration example of a signal inspection system according to the embodiment.

FIG. 6 is a diagram illustrating a configuration example of a signal inspection system 100 including the signal inspection apparatus 1 according to the present embodiment.

The signal inspection system 100 includes the signal inspection apparatuses 1 (1a and 1b) as a plurality of processing units. Each processing unit is connected to an input/output unit 2 (2a and 2b) via an external signal interface, receives an input signal from a controller 3, and outputs a control signal generated in the processing unit.

Each processing unit is provided correspondingly to any signal among the multiplexed signals; and each CPU generates and outputs a control signal based on the input signal.

Note that each processing unit includes storage devices such as ROM (Read Only Memory) and non-volatile memory, reads software stored in the storage devices into RAM (Random Access Memory), and executes the software, thereby implementing various control functions based on an input signal, and the signal inspection functions according to the present embodiment. Further, the RAM stores the sampling data acquired, and provides the data to each processing unit.

For example, a signal generated by way of a door switch 31 provided to the controller 3 is multiplexed; and each signal is transmitted to the processing unit via the input/output unit 2. Each of the control signals generated by way of the plurality of CPUs is input from the external signal interface into the controller 3 via the input/output unit 2.

For example, in a power breaker 32, the controller 3 performs an AND operation on the control signals, and cuts the electric power supplied to a machine tool being a controlled object, based on any control signal.

Note that the configuration of the signal inspection system 100 is an example, and is not limited to this example.

For example, if the multiplexed-signal count increases, three or more processing units may be used in accordance with this. Further, each processing unit may be provided inside the controller 3.

Further, a plurality of input/output units 2 may be provided in accordance with types of signals.

According to the present embodiment, the signal inspection apparatus 1 compares the counts of changes in each multiplexed signal in a predetermined time frame, and if the difference exceeds an allowable value, the signal inspection apparatus 1 performs an output indicating the discrepancy. Therefore, the signal inspection apparatus 1 can detect signal abnormality in a short cycle without depending upon the temporal length during which the discrepancy is occurring, and therefore can appropriately detect discrepancy between the multiplexed signals.

The signal inspection apparatus 1 can appropriately set up a predetermined time frame for counting the change, in accordance with the circumstances. For example, the signal inspection apparatus 1 can also cyclically execute the signal inspection processing, by providing predetermined time frames in succession, and starting counting afresh after a predetermined time frame elapses.

Further, the signal inspection apparatus 1 performs counting in a predetermined time frame including the latest sampled value in each sampling cycle, whereby being capable of detecting in a shorter cycle and further suppressing the failure to detect signal abnormality at the boundary of time frames, as compared to the case of providing predetermined time frames in succession.

Moreover, the signal inspection apparatus 1 performs an output indicating a signal having a higher count of changes than the others, whereby being capable of easily identifying a vibration signal such as chattering.

In addition, since the signal inspection apparatus 1 can be configured as processing units for signals in the controller, the processing units respectively corresponding to the multiplexed signals cross-check each other, whereby being capable of improving the safety.

The embodiment of the present invention has been described above; however, the present invention is not limited to the embodiment described above. Moreover, the effects described in the present embodiment are merely enumeration of the preferable effects arising from the present invention; and the effects according to the present invention are not limited to those described in the present embodiment.

The control method by way of the signal inspection apparatus 1 is implemented by software. When implemented by software, a program(s) composing the software is/are installed in a computer (the signal inspection apparatus 1). Further, such a program(s) may be recorded in a removable medium and distributed to a user, or may be downloaded via a network so as to be distributed to a computer of the user.

EXPLANATION OF REFERENCE NUMERALS 1 signal inspection apparatus
11 acquisition unit
12 count unit
13 calculation unit
14 output unit
100 signal inspection system

What is claimed is:

1. A signal inspection apparatus, comprising:
    an acquisition unit that acquires values of at least two signals among multiplexed signals in a predetermined cycle;
    a count unit that counts respective changes in the at least two signals in a predetermined time frame;
    a calculation unit that sequentially calculates a difference between one signal and an other signal, in the counts of changes in the at least two signals; and
    an output unit that performs an output indicating discrepancy between the one signal and the other signal, if the difference between the counts of changes exceeds an allowable value.

2. The signal inspection apparatus according to claim 1, wherein the count unit starts counting afresh after the predetermined time frame elapses.

3. The signal inspection apparatus according to claim 1, wherein the count unit counts respective changes in the at least two signals in the latest predetermined time frame, in each of the predetermined cycle.

4. The signal inspection apparatus according to claim 1, wherein the output unit performs an output indicating a signal having a higher count of changes, between the one signal and the other signal.

5. A signal inspection system, comprising a plurality of the signal inspection apparatuses according to claim 1, respectively corresponding to the multiplexed signals, wherein
the signal inspection apparatuses each generate and output a control signal based on a corresponding signal.

6. A signal inspection method, causing a computer to execute:
an acquiring step of acquiring values of at least two signals among multiplexed signals in a predetermined cycle;
a counting step of counting respective changes in the at least two signals in a predetermined time frame;
a calculating step of sequentially calculating a difference between one signal and an other signal, in the counts of changes in the at least two signals; and
an outputting step of performing an output indicating discrepancy between one signal and the other signal, if the difference between the counts of changes exceeds an allowable value.

7. A non-transitory computer readable medium storing a signal inspection program for causing a computer to execute:
an acquiring step of acquiring values of at least two signals among multiplexed signals in a predetermined cycle;
a counting step of counting respective changes in the at least two signals in a predetermined time frame;
a calculating step of sequentially calculating a difference between one signal and an other signal, in the counts of changes in the at least two signals; and
an outputting step of performing an output indicating discrepancy between one signal and the other signal, if the difference between the counts of changes exceeds an allowable value.

* * * * *